United States Patent [19]

Yeh et al.

[11] Patent Number: 5,840,607
[45] Date of Patent: Nov. 24, 1998

[54] METHOD OF FORMING UNDOPED/IN-SITU DOPED/UNDOPED POLYSILICON SANDWICH FOR FLOATING GATE APPLICATION

[75] Inventors: Jun-Ker Yeh; Long-Sheng Yeou; Kuo-Sheng Chuang; Siu-Han Liao, all of Hsin Chu, Taiwan

[73] Assignee: Taiwan Semiconductor Manufacturing Company, Ltd., Hsin-Chu, Taiwan

[21] Appl. No.: 729,996

[22] Filed: Oct. 11, 1996

[51] Int. Cl.$^6$ .................................................. H01L 21/336
[52] U.S. Cl. ........................... 438/257; 438/261; 438/264
[58] Field of Search .................................... 438/201, 211, 438/257, 261, 262, 266, 263, 592, 684

[56] References Cited

U.S. PATENT DOCUMENTS

| | | | |
|---|---|---|---|
| 4,441,249 | 4/1984 | Alspector et al. | 438/684 |
| 4,782,033 | 11/1988 | Gierisch et al. | 437/56 |
| 4,874,716 | 10/1989 | Rao | 438/257 |
| 4,978,637 | 12/1990 | Liou et al. | 438/592 |
| 4,992,391 | 2/1991 | Wang | 438/257 |
| 5,210,047 | 5/1993 | Woo et al. | 438/262 |
| 5,256,894 | 10/1993 | Shino | 438/592 |
| 5,272,099 | 12/1993 | Chou et al. | 437/41 |
| 5,395,799 | 3/1995 | Yu | 437/200 |
| 5,441,904 | 8/1995 | Kim et al. | 438/592 |
| 5,445,984 | 8/1995 | Hong et al. | 438/261 |

*Primary Examiner*—Charles Bowers
*Assistant Examiner*—Jack Chen
*Attorney, Agent, or Firm*—George O. Saile; Stephen B. Ackerman; William J. Stoffel

[57] ABSTRACT

The present invention provides a method for forming a transistor having a stacked gate electrode structure with two gates; a lower floating gate and an upper control gate. The floating gate is formed of three polysilicon layers—undoped/doped/undoped polysilicon layers. A substrate is provided having a tunnel oxide layer 20. Then sequentially a first undoped, first doped, and second undoped polysilicon layers 22,24,26 are formed over the tunnel oxide layer thereby forming a lower floating gate layer 22, 24, 26. An intergate dielectric layer 28,30,32 is then formed over the second undoped polysilicon layer 26. Next, an upper control gate 36 and a cap oxide layer are formed over the intergate dielectric layer 28,30,32. The stacked two gate electrode structure is formed by patterning the above mentioned layers. Then spaced source and drain regions 44 are formed on opposite sides of the stacked gate structure thereby completing the transistor.

19 Claims, 2 Drawing Sheets

METHOD OF FORMING UNDOPED/IN-SITU DOPED/UNDOPED POLYSILICON SANDWICH FOR FLOATING GATE APPLICATION

BACKGROUND OF INVENTION

(1) Field of Invention

This invention is related to the fabrication of integrated circuit devices and more particularly, to a method of forming electrodes of such semiconductor devices comprising layers of polysilicon.

(2) Description of Prior Art

Semiconductor technologies have dramatically increased the circuit density upon a chip. The miniaturized devices built in and on a semiconductor substrate are very closely spaced and their packing density has increased significantly. The more recent advances in photolithographic technique, such as phase shifting masks, and self aligning process steps have ever reduced the device size and increased circuit density. This has lead to ultra large scale integration with minimum device dimensions less than a micron and more than a million transistors on a chip. To continue this trend, one challenge facing manufacturers is manufacturing gate electrodes, especially floating gate electrodes used to make EPROM, flash and EEPROM devices.

Basic floating gate electrodes are presently formed by first depositing a tunnel oxide layer over a substrate. Next, a first conductive layer, which comprises the floating gate (Gate #1) is formed over the tunnel oxide. Then an intergate dielectric layer, such as a silicon oxide layer, is formed over the floating gate. A second conductive layer, which comprised the control gate (Gate #2) is formed over the intergate dielectric layer. Lastly, a top insulating layer of oxide is formed over the control gate. The floating gate and control gates can be formed of a doped polysilicon. These four layers are then patterned to form dual gate structure with the lower, floating gate.

This floating electrode the disadvantage where the floating gate is formed of a doped polysilicon, the rough polysilicon surface will act as an impurity (e.g., phosphorous) diffusion path and degrade the tunnel oxide. The doped polysilicon has a large grain size that provides a greater surface roughness. The impurity ion diffuse easily along the rough surface and degrade the tunnel oxide. The rough or large grained polysilicon can cause non-uniform erasure. Second, it is difficult to control the thickness of the oxide in the first dielectric layer because of the impurity doping in the floating gate. The impurity causes faster oxide growth. The non-uniformity and variability affects the capacitances, voltages and performances of the floating gate and memory device.

Many practitioners have attempted to improve the gate electrode. For example, U.S. Pat. No. 5,395,799 (Yu) teaches a method of fabricating electrodes having four successive layers of silicon dioxide, undoped polysilicon, undoped WSi, and a top layer of silicon dioxide on silicon nitride. The four layers are patterned to provide a gate electrode. U.S. Pat. No. 5,272,099 (Chou et al) teaches a method of forming a gate electrode using doped polysilicon layers. The patent forms a doped polysilicon layer over a gate oxide and then forms an undoped polysilicon layer over the doped layer. The undoped layer is then doped by an ion implantation. U.S. Pat. No. 4,782,033 (Gierisch) shows a method of producing a doped polysilicon gate by out diffusion of boron from an implanted silicide gate. However, the floating gate can be further improved by increasing the program/erasure speed and uniformity.

SUMMARY OF INVENTION

It is an objective of the present invention to provide a method of forming a two gate electrode structure including a floating gate where the floating gate is formed of a three layer polysilicon sandwich comprising an undoped/doped/undoped polysilicon layer.

It is an objective of the present invention to provide a floating gate that has an improved erasure rate and uniformity.

It is another objective of the present invention to form a floating polysilicon gate that has a controllable even oxidation rate, a smaller polysilicon grain size and a smoother surface than a doped polysilicon gate.

To accomplish the above objectives, the present invention provides a method for forming a transistor having an gate electrode structure with two gates; a lower floating gate and an upper control gate. The floating gate is formed in a sandwich structure comprising three polysilicon layers—(1) undoped/ (2) doped/ (3) undoped polysilicon layers. A substrate is provided having a tunnel oxide layer 20. Then sequentially a first undoped, first doped, and second undoped polysilicon layers 22, 24, 26 are formed over the tunnel oxide layer thereby forming a (lower) floating gate layer 22, 24, 26. An intergate dielectric layer 28,30,32 is then formed over the second undoped polysilicon layer 26. The intergate dielectric layer is preferably comprised of a first oxide layer 28, a nitride layer 30, and a second oxide layer 32 (O.N.O.). Next, an upper control gate 34,36 is formed over the intergate dielectric layer 28,30,32. The upper control gate is preferably formed of a control gate doped polysilicon layer 34 and a control gate metal silicide layer 36. A cap oxide is formed over the upper control gate. The stacked two gate electrode structure is formed by patterning the cap oxide layer 38, the control gate 34,36, the intergate dielectric layer 28,30,32, the second undoped polysilicon layer 26, the first doped polysilicon layer 24, the first undoped polysilicon layer 22, and the tunnel oxide layer 20. Then spaced source and drain regions 44 on opposite sides of the stacked gate are formed, thereby forming the transistor.

BRIEF DESCRIPTIONS OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1 through 4 cross sectional views of the double gate electrode having the bottom gate of the present invention.

FIG. 5 is a graph of the threshold voltage vs the erase time comparing the floating gate structure (line 60) of the present invention with a floating gate (line 62) of the prior art.

DETAILED DESCRIPTION OF THE PREFERRED EMBODIMENTS

The present invention provides a method of forming a transistor having an undoped/doped/undoped sandwich polysilicon floating gate on a substrate. The present invention will be described in detail with reference to the accompanying drawings. The term "substrate" is meant to include devices formed within a semiconductor wafer, such as doped regions, and the layers overlying the wafer, such as insulation and conductive layers.

Figure 1:
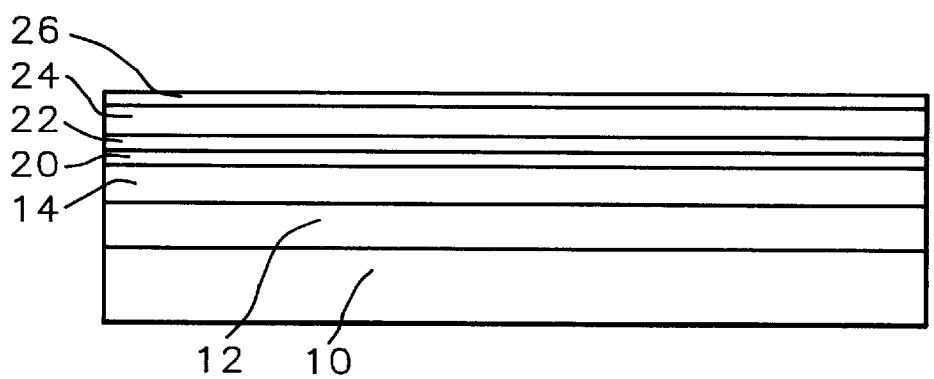

The invention begins by providing a semiconductor substrate having a tunnel oxide layer 20. The substrate is preferably a silicon substrate having a (1,0,0) orientation and a p-background doping. The substrate also can include n-wells and p-wells as shown in FIG. 1. The tunnel oxide layer 20 is preferably formed of silicon oxide having a thickness in a range of between about 80 and 100 Å. The tunnel oxide can be formed using a conventional thermal oxidation process.

In an important step, the lower, floating gate 22, 24, 26 is formed by depositing 3 layers—the first undoped polysilicon layer 22 is formed, followed by the forming of the first doped polysilicon layer 24 and the second undoped polysilicon layer 26, as shown in FIG. 1.

The first undoped polysilicon layer 22 can be deposited by pyrolyzing silane in a LPCVD (low pressure chemical vapor deposition process) at a temperature of less than 600 C. The first undoped polysilicon layer is preferably formed by using a LPCVD process with $SiH_4$ and $N_2$ at a temperature in a range of between about 540° and 600° C., at a pressure in a range of between about 500 and 800 mtorr.

The first undoped polysilicon layer 22 preferably has a thickness in a range of between about 100 and 200 Å. The undoped polysilicon layer has significantly small grain size than a conventional doped polysilicon layer. The small undoped first polysilicon grain size will smooth the surface between tunnel oxide 20 and first undoped polysilicon layer 22. This reduces the phosphorous impurity diffusion form the overlying first doped polysilicon layer 24 (see below). This prevents the tunnel oxide from degrading.

Next, the first doped polysilicon layer 24 is preferably formed by using an in-situ doping process using silane ($SiH_4$) and $PH_3$ reactants at a temperature in a range of between about 540° and 600° C., at a pressure in a range of between about 500 and 800 mtorr. The first doped polysilicon layer 24 has a thickness in a range of between about 900 and 1100 Å and more preferably between 975 and 1025 Å and more preferably about 1000 Å.

The second undoped polysilicon layer 26 is preferably formed by using a LPCVD (low pressure chemical vapor deposition) process with $SiH_4$ reactants at a temperature in a range of between about 540° and 600° C., at a pressure in a range of between about 500 and 800 mtorr and has a thickness in a range of between about 200 and 300 Å.

Figure 2:
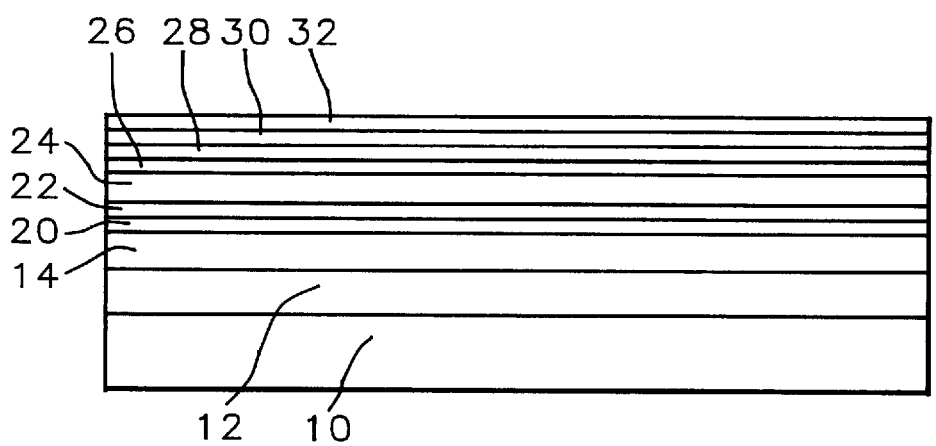

As shown in FIG. 2, an intergate dielectric layer 28, 30 32 is formed over the floating gate 22, 24, 26. The intergate dielectric layer can be formed of polyoxide, silicon nitride (N), silicon oxide (O) or a three layer sandwich structure of ONO (oxide/nitride/oxide layers) and is preferably formed of ONO.

An intergate dielectric layer formed of ONO can be formed as follows. A first oxide layer 28 is formed over the floating gate 22,24,26, followed by the formation of a nitride layer 30, and a second oxide layer 32.

The first oxide layer 28 is preferably formed using a wet thermal oxide process at a temperature in a range of between about 900° and 1000° C. and has a thickness in a range of between about 50 and 80 Å and more preferably about 65 Å. A major advantage of the invention is that the second undoped polysilicon layer 26 has a lower oxidation rate than a doped polysilicon layer which allows better control of the first oxide layer 28 thickness and thinner first oxide layers. This increases the gate couple ratio and also improves the program/erase speeds. See FIG. 5.

The nitride layer 30 is preferably formed using a low pressure chemical vapor deposition (LPCVD) process with dichlorosilane ($SiH_2Cl_2$) and ammonia ($NH_3$) at a temperature in a range of between about 650° and 750° C. and a pressure in the range of between about 0.25 and 2.0 mTorr and a thickness in the range of between about 110 and 130 Å and more preferably about 120 Å.

The second oxide layer 32 can be grown by a conventional wet oxidation process at a temperature in a range of between about 900° and 1000° C. and has a thickness in the range of between about 30 and 50 Å (over the nitride layer 30). The second oxide layer 32 can also be formed using a HTO process.

Figure 3:
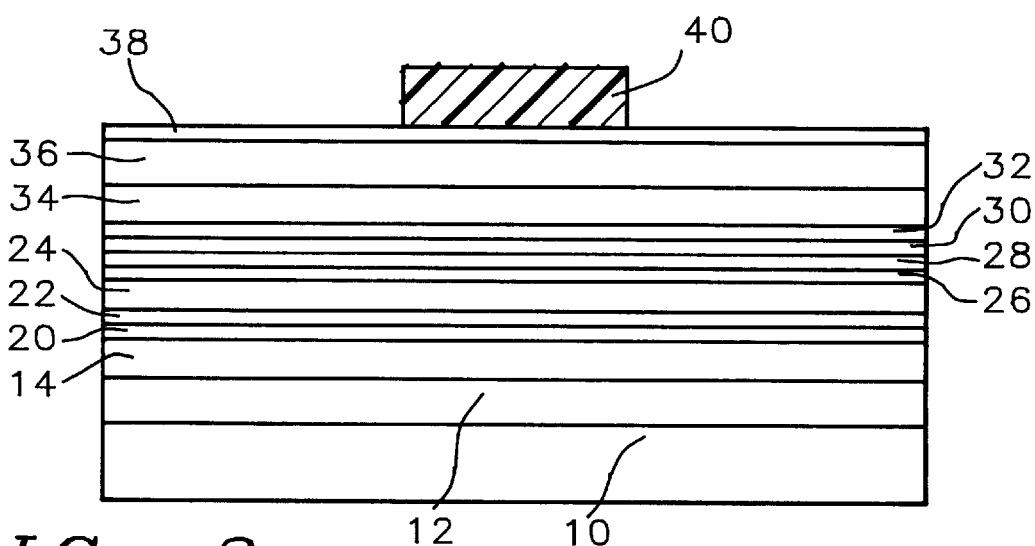

As shown in FIG. 3, an upper control gate is formed over the intergate dielectric layer. Preferably a control gate doped polysilicon layer 34 (second doped polysilicon layer 34) and control gate metal silicide layer 36 are formed over the second oxide layer 32, thereby forming a control gate layer 34,36.

The second doped polysilicon layer 34 is preferably formed by depositing a polysilicon layer by pyrolyzing silane diluted in nitrogen with a concentration in a range of between about 20 and 30% and at temperature in a range of between about 620 and 640° C. The second doped polysilicon layer preferably has a thickness in the range of between about 1500 and 2000 Å. The polysilicon layer 34 can be doped using a $POCl_3$ glass layer diffusion.

The metal silicide layer 36, is preferably composed of tungsten silicide, and preferably has a thickness in a range of between about 1500 and 2000 Å.

A cap oxide layer 38 is then formed over the control gate layer 34,36. The cap oxide layer 38 is formed over the metal silicide layer 36. The cap oxide layer can be formed using a conventional oxidation process, such as a TEOS deposition. The cap oxide layer preferably has a thickness in a range of about 1000 and 1500 Å. The cap oxide layer 38 functions to reduce silicide ($WSi_x$) resistance.

Also shown in FIG. 3, the photo resist layer 40 is used to form a stacked gate structure by patterning the cap oxide layer 38, the tungsten silicide layer 36, the second doped polysilicon layer 34, the second oxide layer 32, the silicon nitride layer 30, the first oxide layer 28, the second undoped polysilicon layer 26, the first doped polysilicon layer 24, the first undoped polysilicon layer 22, and the tunnel oxide layer 20.

Figure 4:
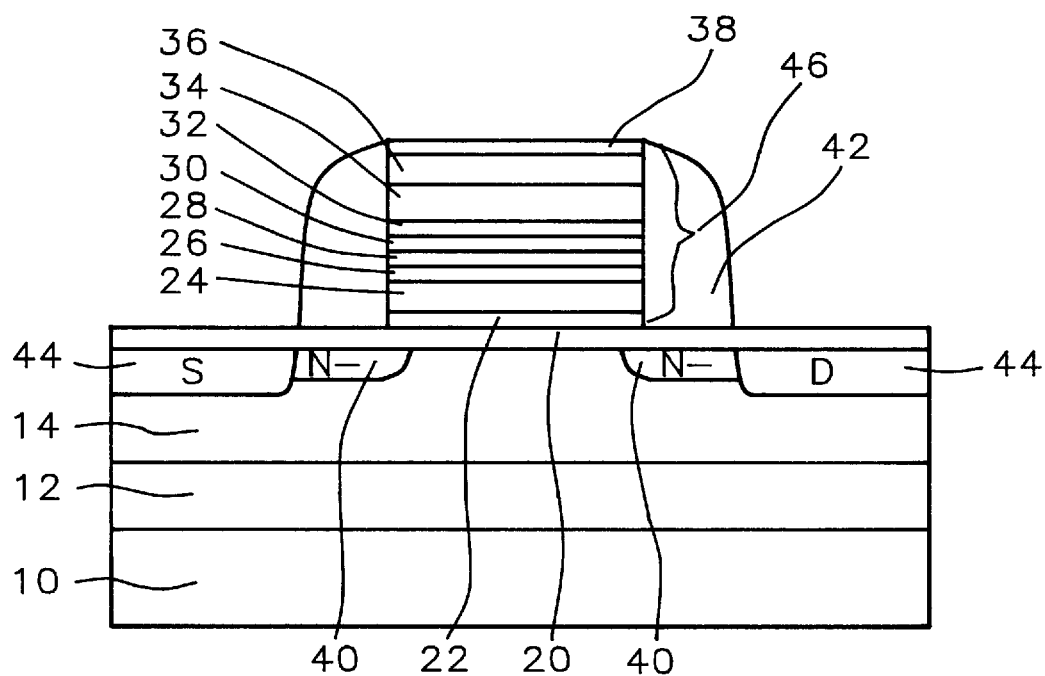

As shown in FIG. 4, spaced lightly doped source and drain regions 40 are formed on opposite sides of the stacked gate 46. Next, sidewall spacers 42 are formed on the gate electrode sidewalls. The sidewall spacers are preferably formed of silicon oxide and preferably have a thickness in a range of between about 2000 and 2500 Å.

Still referring to FIG. 4, spaced source and drains 44 are formed preferably by implanting impurities into the substrate using the spacers 42 as a mask. The source/drain regions 40 42 and the two gate electrode structure 20 22 24 26 28 30 32 34 36 38 form the transistor of the present invention.

The invention provides a method form forming a two gate electrode structure. The lower gate (e.g., the floating gate) is formed of three polysilicon layers. The middle polysilicon layer 24 is doped, while the lower 22 and upper 26 polysilicon layers are undoped. The upper and lower undoped polysilicon layers 22 26 provide the transistor with superior electrical characteristics.

First, the undoped polysilicon layers have smaller grain sizes than doped polysilicon layers. The smaller grain sizes on the lower undoped layer 22 reduce improve the uniformity of erasure by providing a smooth surface which reduces the diffusion path. This protects the tunnel oxide from degradation. This also provides more uniform erasure.

Second, the upper undoped polysilicon layer 26 reduces the oxidation rate which allows better process control of the overlying ONO layer (in particular the first oxide layer 28). The reduced polyoxidation rate allows a thinner, more controlled first oxide layer 28 to be formed which increases the gate couple ratio. This also improves the program/erase speed.

Third, the smaller grains of the first undoped polysilicon layer 22 provide a smooth surface with reduces the Phosphorous diffusion path. The reduced Phosphorous diffusion path is a benefit because the phosphorus will degrade the tunnel oxide.

The dual gate structure with the three layer lower gate can be used in any semiconductor application where one gate is positioned at least partially over a second gate. The invention can be implement in devices, such as EPROM, Flash EPROM, EEPROM devices, but is not limited to these devices types.

Figure 5:
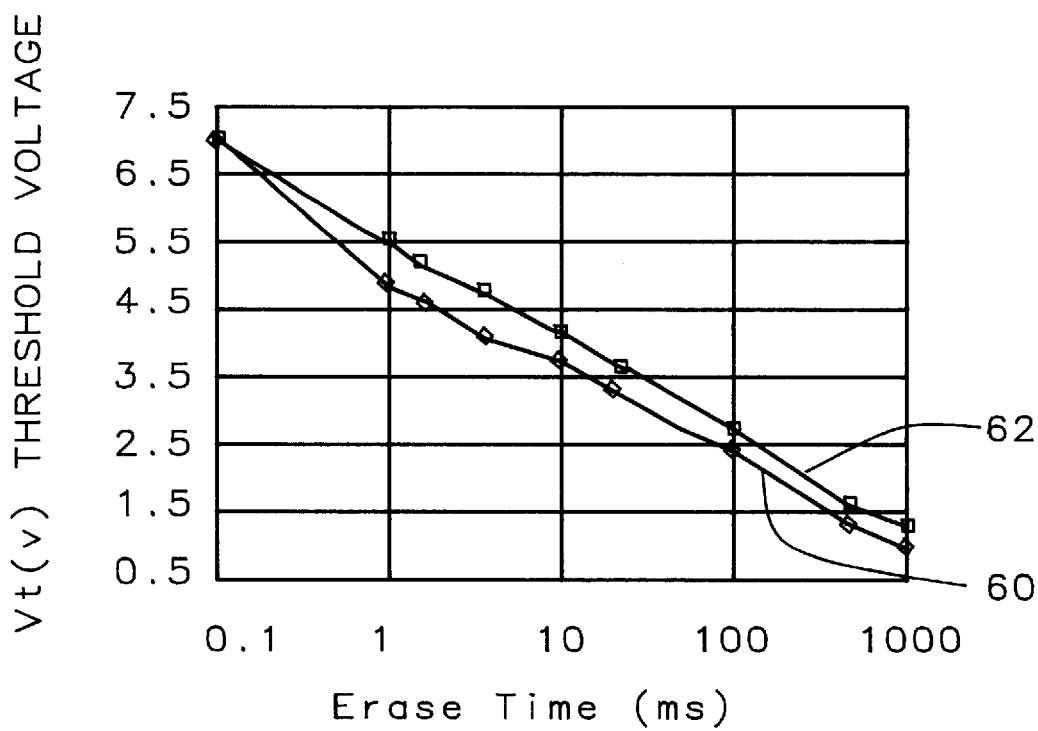

FIG. 5 is a graph of the threshold voltage vs the erase time comparing the floating gate structure of the present invention with a floating gate of the prior art. The erase time for the U/D/U floating gate of the invention is shown as line 60 and the conventional doped floating gate is shown as line 62. The erase speed is measured at Vg=−10, and Vs=4.3. The three layered floating gate (U/D/U) 60 has a faster erase time for a given threshold voltage. This increase device performance.

As can be seen in Table 1 below, the triple polysilicon (U/D/U) layer gate of the present invention provides a lower C-V effective oxide thickness. The steam oxide has a thickness of about 1800 over silicon and 30–50 Å over the nitride layer.

TABLE 1

C-V electrical thickness of the floating gate
65 Å oxide/120 Å Si$_3$N$_4$/1800 Å steam oxide

| Process | C-V effective oxide thickness |
|---|---|
| doped polysilicon - prior art process | 220 Å |
| 3 layers - undoped/doped/undoped polysilicon - the invention | 205 Å |

While the invention has been particularly shown and described with reference to the preferred embodiments thereof, it will be understood by those skilled in the art that various changes in form and details may be made without departing from the spirit and scope of the invention.

What is claimed is:

1. A method for forming a transistor having a floating gate comprised of an undoped/in-situ doped/undoped polysilicon sandwich on a substrate, the method comprising:

a) forming a tunnel oxide layer on said substrate;
   b) forming a floating gate layer over said tunnel oxide layer by sequentially forming a first undoped polysilicon layer, a first doped polysilicon layer and a second undoped polysilicon layer;
   c) forming an intergate dielectric layer over said floating gate layer;
   d) forming a control gate over said intergate dielectric layer;
   e) forming a cap oxide layer over said control gate;
   f) patterning said cap oxide layer, said control gate said intergate dielectric layer said second undoped polysilicon layer said first doped polysilicon layer said first undoped polysilicon layer and said tunnel oxide layer thereby forming a stacked gate structure.

2. The method of claim 1 wherein said intergate dielectric layer is formed by sequentially forming a first oxide layer, a nitride layer and a second oxide layer, and said first oxide layer is formed using a wet thermal oxidation process at a temperature in a range of between about 900° and 1000° C. and has a thickness in a range of between about 50 and 80 Å.

3. The method of claim 2 wherein said nitride layer is formed using a low pressure chemical vapor deposition process with dichlorosilane and ammonia at a temperature in a range of between about 650° and 750° C. and a pressure in the range of between about 0.25 and 2.0 mTorr and a thickness in the range of between about 110 and 130 Å.

4. The method of claim 2 wherein said second oxide layer is deposited using a wet oxidation process at a temperature in a range of between about 800° and 900° C. and a thickness in a range of between about 30 and 50 Å over said nitride layer.

5. The method of claim 1 wherein said control gate is formed by sequentially forming a control gate doped polysilicon layer and a control gate tungsten silicide layer over said intergate dielectric layer.

6. The method of claim 5 wherein said control gate doped polysilicon layer is formed by depositing a polysilicon layer by pyrolyzing silane at a temperature in a range of between about 620° and 640° C., and doping said control gate doped polysilicon layer using POCl$_3$ diffusion and said control gate doped polysilicon layer has thickness in the range of between about 1500 and 2000 Å.

7. The method of claim 5 wherein said control gate tungsten silicide layer has a thickness in a range of between about 1500 and 2000 Å.

8. The method of claim 1 wherein said first undoped polysilicon layer is formed by using SiH$_4$ and N$_2$ at a temperature in a range of between about 540° and 600° C., at a pressure in a range of between about 500 and 800 mtorr and has a thickness in a range of between about 100 and 200 Å.

9. The method of claim 1 wherein said first doped polysilicon layer is formed by using an in-situ doping process using silane and PH$_3$ reactants at a temperature in a range of between about 540° and 600° C., at a pressure in a range of between about 500 and 800 mtorr, and has a thickness in a range of between about 900 and 1100 Å.

10. The method of claim 1 wherein said second undoped polysilicon layer is formed by using dichlorosilane at a temperature in a range of between about 540° and 600° C., at a pressure in a range of between about 500 and 800 mtorr and has a thickness in a range of between about 200 and 300 Å.

11. A method for forming a transistor having an undoped/doped/undoped polysilicon sandwich floating gate on a substrate comprising:

a) forming a tunnel oxide layer on said substrate;
   b) sequentially forming a first undoped polysilicon layer, a first doped polysilicon layer and a second undoped polysilicon layer thereby forming a floating gate layer;
   c) sequentially forming a first oxide layer, a nitride layer, a second oxide layer over said second undoped polysilicon layer thereby forming an intergate dielectric layer;
   d) sequentially forming a control gate doped polysilicon layer and a control gate tungsten silicide layer over said second oxide layer thereby forming a control gate layer;

e) forming a cap oxide layer over said tungsten silicide layer;

f) patterning said cap oxide layer, said tungsten silicide layer, said control gate doped polysilicon layer, said second oxide layer, said nitride layer, said first oxide layer, said second undoped polysilicon layer, said first doped polysilicon layer, said first undoped polysilicon layer, and said tunnel oxide layer thereby forming a stacked gate;

g) forming spaced source and drain regions on opposite sides of said stacked gate thereby forming said transistor.

12. The method of claim 11 wherein said first doped polysilicon layer is formed by using an in-situ doping process using silane ($SiH_4$) and $PH_3$ reactants at a temperature in a range of between about 540° and 600° C., at a pressure in a range of between about 500 and 800 mtorr, and has a thickness in a range of between about 900 and 1100 Å.

13. The method of claim 11 wherein said second undoped polysilicon layer is formed by using dichlorosilane at a temperature in a range of between about 540° and 600° C., at a pressure in a range of between about 500 and 800 mtorr and has a thickness in a range of between about 200 and 300 Å.

14. The method of claim 11 wherein said first oxide layer is formed using a wet thermal oxide process at a temperature in a range of between about 900° and 1000° C. and has a thickness in a range of between about 50 and 80 Å.

15. The method of claim 11 wherein said nitride layer is formed using a low pressure chemical vapor deposition process with dichlorosilane and ammonia at a temperature in a range of between about 650° and 750° C. and a pressure in the range of between about 0.25 and 2.0 mTorr and a thickness in the range of between about 110 and 130 Å.

16. The method of claim 11 wherein said second oxide layer is deposited using wet oxidation process at a temperature in a range of between about 800° and 900° C. and a thickness in the range of between about 30 and 50 Å over said nitride layer.

17. The method of claim 11 wherein said control gate doped polysilicon layer is formed by depositing a polysilicon layer by pyrolyzing silane at a temperature in a range of between about 620° and 640° C., and doping said control gate doped polysilicon layer using a $POCl_3$ diffusion and having a thickness in the range of between about 1500 and 2000 Å.

18. The method of claim 11 wherein said control gate tungsten silicide layer has a thickness in a range of between about 1500 and 2000 Å.

19. A method for forming a transistor having an undoped/doped/undoped polysilicon sandwich floating gate on a substrate comprising:

a) forming a tunnel oxide layer on said substrate;

b) sequentially forming a first undoped polysilicon layer, a first doped polysilicon layer and a second undoped polysilicon layer thereby forming a floating gate layer; said first undoped polysilicon layer is formed by using $SiH_4$ and $N_2$ at a temperature in a range of between about 540° and 600° C., at a pressure in a range of between about 500 and 800 mtorr and said first undoped polysilicon layer has a thickness in a range of between about 100 and 200 Å;

c) sequentially forming a first oxide layer, a nitride layer, a second oxide layer over said second undoped polysilicon layer thereby forming an intergate dielectric layer;

d) sequentially forming a control gate doped polysilicon layer and a control gate tungsten silicide layer over said second oxide layer thereby forming a control gate layer;

e) forming a cap oxide layer over said tungsten silicide layer;

f) patterning said cap oxide layer, said tungsten silicide layer, said control gate doped polysilicon layer, said second oxide layer, said nitride layer, said first oxide layer, said second undoped polysilicon layer, said first doped polysilicon layer, said first undoped polysilicon layer, and said tunnel oxide layer thereby forming a stacked gate;

g) forming spaced source and drain regions on opposite sides of said stacked gate thereby forming said transistor.

* * * * *